(12) United States Patent
Wacquez et al.

(10) Patent No.: US 7,994,008 B2
(45) Date of Patent: Aug. 9, 2011

(54) TRANSISTOR DEVICE WITH TWO PLANAR GATES AND FABRICATION PROCESS

(75) Inventors: Romain Wacquez, Grenoble (FR); Philippe Coronel, Barraux (FR); Damien Lenoble, Ixelles (FR); Robin Cerutti, Tarrytown, NY (US); Thomas Skotnicki, Crolles-Montfort (FR)

(73) Assignee: STMicroelectronics (Crolles 2) SAS, Crolles Cedex (FR)

( * ) Notice: Subject to any disclaimer, the term of this patent is extended or adjusted under 35 U.S.C. 154(b) by 447 days.

(21) Appl. No.: 11/698,755

(22) Filed: Jan. 26, 2007

(65) Prior Publication Data
US 2007/0194355 A1    Aug. 23, 2007

(30) Foreign Application Priority Data
Feb. 3, 2006  (FR) ...................................... 06 00970

(51) Int. Cl.
*H01L 21/336* (2006.01)
(52) U.S. Cl. . 438/272; 438/212; 438/268; 257/E21.621; 257/E21.625; 257/E21.629; 257/E21.633; 257/E21.635
(58) Field of Classification Search .................. 438/212, 438/268, 270, 272; 257/E21.621, E21.625, 257/E21.629, E21.633, E21.635, E21.638
See application file for complete search history.

(56) References Cited

U.S. PATENT DOCUMENTS

| | | | | |
|---|---|---|---|---|
| 7,101,762 B2 * | 9/2006 | Cohen et al. | .................. | 438/283 |
| 7,141,837 B2 * | 11/2006 | Coronel et al. | ............... | 257/241 |
| 7,381,601 B2 * | 6/2008 | Kim et al. | ...................... | 438/197 |
| 2004/0016968 A1 * | 1/2004 | Coronel et al. | ............... | 257/347 |
| 2004/0119142 A1 * | 6/2004 | Grossi et al. | ................... | 257/536 |
| 2005/0167750 A1 * | 8/2005 | Yang et al. | ..................... | 257/347 |
| 2005/0184325 A1 * | 8/2005 | Jacquet et al. | ................ | 257/300 |
| 2005/0189583 A1 * | 9/2005 | Kim et al. | ...................... | 257/327 |
| 2005/0239238 A1 * | 10/2005 | Schuele et al. | ................ | 438/149 |
| 2005/0242398 A1 * | 11/2005 | Chen et al. | ..................... | 257/348 |
| 2006/0022275 A1 * | 2/2006 | Ilicali et al. | .................... | 257/366 |
| 2006/0027881 A1 * | 2/2006 | Ilicali et al. | .................... | 257/401 |
| 2006/0134882 A1 * | 6/2006 | Zhang | ........................... | 438/424 |
| 2006/0240622 A1 * | 10/2006 | Lee et al. | ....................... | 438/257 |
| 2009/0289304 A1 * | 11/2009 | Pouydebasque et al. | ..... | 257/351 |

FOREIGN PATENT DOCUMENTS

KR    1020050033200    *  4/2005

OTHER PUBLICATIONS

Wong, et al., "Self-Aligned (Top and Bottom) Double-Gate MOSFET with a 25 nm Thick Silicon Channel,"Technical Digest, International Electron Devices Meeting (IDEM 97), Dec. 7, 1997, pp. 427-430; XP002391499.
Guarini, et al., "Triple-Self-Aigned, Planar Dougl-Gate MOSFETs: Devices and Circuits,"IDEM 2001; 19.2.1-19.2.4, pp. 425-428.
Preliminary French Search Report, FR 06 00970, dated Jul. 21, 2006.

* cited by examiner

*Primary Examiner* — Matthew Smith
*Assistant Examiner* — Su C Kim
(74) *Attorney, Agent, or Firm* — Andre M. Szuwalski; Gardere Wynne & Sewell LLP

(57) ABSTRACT

A planar transistor device includes two independent gates (a first and second gates) along with a semiconductor channel lying between the gates. The semiconductor channel is formed of a first material. The channel includes opposed ends comprising dielectric zone with a channel region positioned between the gates. The dielectric zones comprises an oxide of the first material.

12 Claims, 4 Drawing Sheets

TRANSISTOR DEVICE WITH TWO PLANAR GATES AND FABRICATION PROCESS

PRIORITY CLAIM

The present application claims priority from French Application for Patent No. 06 00970 filed Feb. 3, 2006, the disclosure of which is hereby incorporated by reference.

BACKGROUND OF THE INVENTION

1. Technical Field of the Invention

The present invention relates to the field of integrated circuits and more particularly to transistors produced in such integrated circuits.

2. Description of Related Art

A process for manufacturing transistors with two independent gates of the planar type, by transfer, is known from the article "Triple-self-aligned, planar double-gate MOSFET's: devices and circuits" by K. W. Guarini et al., IBM T. J. Watson Research Center published in 0-7803/7052-X/01/$10.00(c) 2001 IEEE. The main limitation of this technology is its cost.

There is a need in the art to remedy this drawback.

There is also a need in the art for an improved transistor with good decoupling between the gates.

There is also a need in the art to produce a transistor with two independent planar gates, at a competitive and reliable fabrication cost.

SUMMARY OF THE INVENTION

A planar transistor device with two independent gates comprises first and second gates, a semiconductor channel lying between the gates and comprising a first material, and a dielectric zone lying between the gates, defining the semiconductor channel and comprising an oxide of the first material. The dielectric zone prevents the appearance of any parasitic capacitance between the gates. The dielectric zone may be obtained by oxidation of part of the material constituting the semiconductor channel. The semiconductor channel and the dielectric zone may be self-aligned with the gates. A single lithography operation may thus define an upper gate and a lower gate, ensuring excellent geometry of the elements of the transistor and reducing parasitic capacitance.

In one embodiment, the first material comprises silicon. Thus, the dielectric zone may comprise a silicon oxide.

In one embodiment, the device comprises two dielectric zones lying on either side of the semiconductor channel.

In one embodiment, the device comprises a silicon-containing layer lying beneath the first gate. A dielectric layer may be placed beneath the silicon-containing layer lying beneath the first gate. Thus, good isolation is achieved.

In one embodiment, the device comprises a dielectric layer lying on top of the second gate.

In one embodiment, the device comprises a layer that is permeable to the implantation of oxygen and lies on top of the gates. Thus, part of the silicon-based layer may be oxidized in order to define the channel.

In one embodiment, the device comprises a source and a drain lying on either side of the channel, the source, the drain and the channel being slightly oxygen-enriched.

In one embodiment, the device comprises a dielectric layer lying between the gates and the channel. Said dielectric layer may have a thickness of less than that of the gates or of the channel but may comprise silicon oxide. Said dielectric layer is often called a "gate oxide".

In one embodiment, the device comprises a silicon-on-insulator substrate.

In another embodiment, the device comprises a germanium-on-insulator substrate, especially a silicon-germanium and/or germanium alloy as predominant species.

A process for fabricating a planar transistor with two independent gates includes forming first and second gates, a semiconductor channel lying between the gates and comprising a first material, and a dielectric zone lying between the gates, defining the semiconductor channel and comprising an oxide of the first material.

In one method of implementation, the dielectric zone is formed by the selective oxidation of part of the material forming the semiconductor channel. Thus, a dielectric zone can be created so as to reduce parasitic capacitance between the gates. The selective oxidation may comprise an implantation of oxygen ions.

In one method of implementation, the dielectric zone is formed by transformation annealing of the oxidized material. This promotes suitable diffusion of oxygen into the material that has to be oxidized.

In one method of implementation, the selective oxidation of part of the material forming the semiconductor channel is carried out by means of a mask largely impermeable to the oxygen implantation covering the channel and the active zones and by means of a mask that is permeable to the oxygen implantation covering the gates. The permeable mask allows the first material to be selectively etched. This results in the gates and the channel being self-aligned.

In one method of implementation, the gates are formed by the selective removal of a material that can be etched selectively with respect to the first material and the deposition of a conducting material.

In one method of implementation, the semiconductor channel is formed by the deposition of a layer of a material that is a semiconductor in the crystalline state and a dielectric in the oxidized state.

In one method of implementation, the layer of a semiconductor material is formed on a layer that can be selectively etched with respect to said material, and a layer that can be selectively etched with respect to said material is formed on said layer of semiconductor material. Thus, the future position of the gates can be reserved.

In one method of implementation, the layer that can be etched selectively with respect to said material comprises SiGe. SiGe exhibits good etching selectivity with respect to silicon and can thus be removed during the fabrication process.

Advantageously, the gates are formed self-aligned. The same mask thus serves to define the two gates, ensuring good alignment of the gates and the semiconductor channel.

The use of sacrificial layers based on SiGe, which is then selectively etched with respect to silicon, proves to be particularly advantageous. The definition of the upper gate and the lower gate by a single lithography operation also aligns the silicon film lying between the gates. Silicon zones liable to be at an ineffectively controlled potential are then created, and a risk of parasitic capacitance between the gates exists. Thanks to the invention, such zones are selectively oxidized in order to give them the desired dielectric properties. The gates are thus decoupled, hence a transistor of excellent quality.

In one method of implementation, the fabrication process may start from a silicon-on-insulator or SOI substrate on which an alternation of SiGe-based layers and Si-based layers is formed. Next, the gates may be etched, stopping on the silicon-on-insulator substrate, then the silicon-based sources and drains may be formed, then a protective layer may be deposited and the SiGe-containing layers etched, while preserving the other layers, a localized implantation of oxygen may then be carried out followed by annealing, so as to create the desired dielectric zones, then the gate oxide may be formed followed by the body of the gate proper, and finally the junctions may be implanted, ensuring silicidation of the contacts and covering of the entire circuit. The protective layer serves to define unoxidized zones and may be removed after the oxidation.

In an embodiment, a planar transistor device comprises: a channel layer formed of a silicon material and including a source region, channel region and drain region, and further including at a first end thereof a first insulating region formed of an oxide of the silicon material and also at a second end thereof a second insulating region formed of an oxide of the silicon material; a first gate formed of a conductive material positioned below the channel layer at the channel region; and a second gate formed of a conductive material positioned above the channel layer at the channel region.

In an embodiment, a process for fabricating a planar transistor with two independent gates comprises: forming a first layer of a sacrificial material; forming a second layer of a silicon material overlying the first layer; forming a third layer of the sacrificial material overlying the second layer; oxidizing first and second ends of the second layer to form first and silicon oxide insulating regions between which exist a source region, channel region and drain region; removing the sacrificial material of the first and third layers to form voids above and below the channel region of the second layer; and filling the voids with a conductive material to form an upper and lower gate of the transistor.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
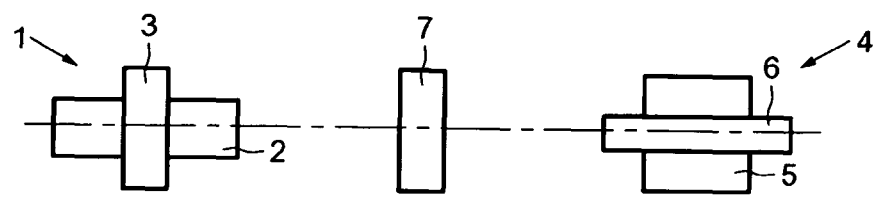
FIG. 1 is a schematic top view of the gates and active zones of a transistor placed in an integrated circuit.

As illustrated in FIG. 1, a transistor 1 comprises an active zone 2 oriented in a first direction and a gate 3 oriented in a second direction, perpendicular to the first, said two directions defining a plane. This plane will be referred to hereafter, and by convention, as the "main plane". A transistor 4 belonging to the same integrated circuit as the transistor 1 comprises an active zone 5 and a gate 6 oriented in the first direction. A gate 7 lies between the transistors 1 and 4 and may serve as junction between two other transistors (not shown). The gate 7 is oriented in the second direction. This arrangement makes it possible for the various fabrication steps and the various parts of the transistors to be clearly seen in FIGS. 2 to 9.

Figure 2:
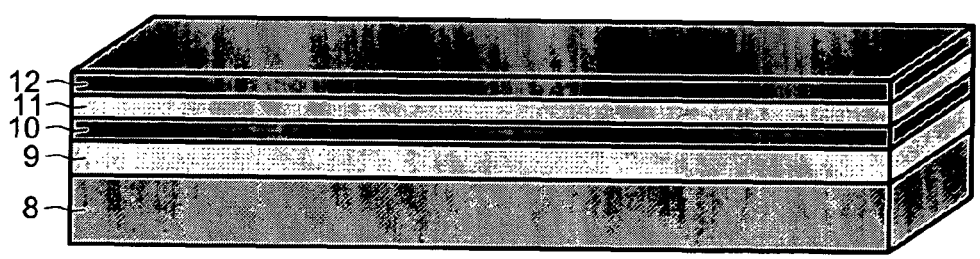
FIGS. 2 to 9 are respective exploded views of steps in the fabrication of a transistor in an integrated circuit corresponding to FIG. 1.

As illustrated in FIG. 2, starting from an SOI-type substrate comprising a dielectric well 8 surmounted by a layer 9 comprising silicon, an alternation of layers comprising SiGe and layers comprising Si is formed, for example by epitaxy. The layer 10 placed on the layer 9 may comprise SiGe. The layer 11 placed on the layer 10 may comprise Si and the layer 12 placed on the layer 11 may comprise SiGe.

Figure 3:
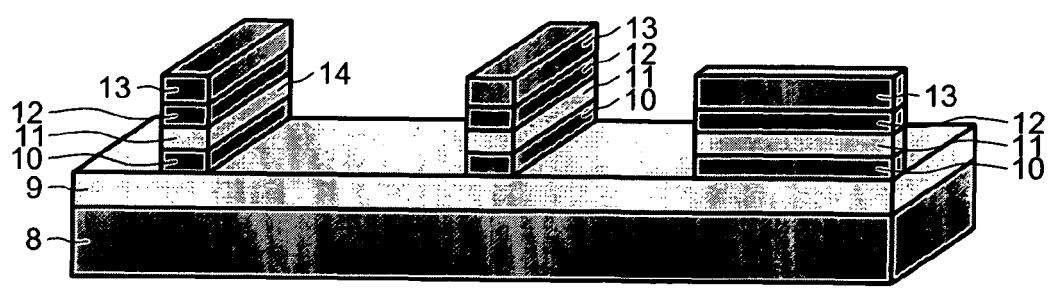

As illustrated in FIG. 3, an oxide-based hard mask 13 is then deposited. The hard mask may comprise a dielectric bilayer, for example comprising a sublayer based on silicon oxide on which is placed a sublayer based on TEOS (tetraethyl orthosilicate) on top of the SiGe-based layer 12. Next, an etching step is carried out, stopping on the silicon-based layer 9 of the substrate, thus defining the future positions of the gates 3, 6 and 7. Left behind, between the remaining portions of the SiGe-based layers 10 and 12, is a portion of the Si-based layer 11 that will subsequently form the semiconductor channel 14 of the transistors. The TEOS-based sublayer may have been removed by the etching.

Figure 4:
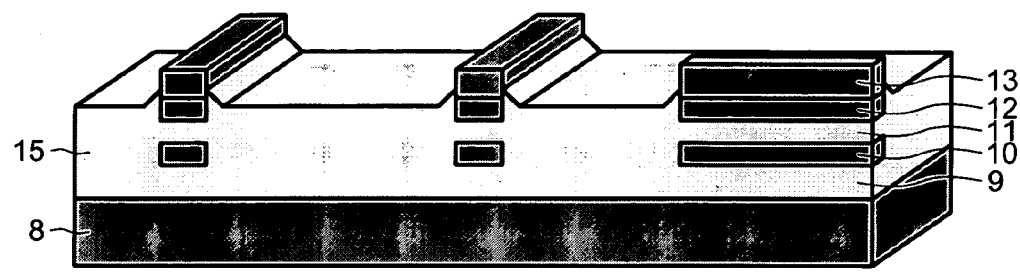
Figure 5:
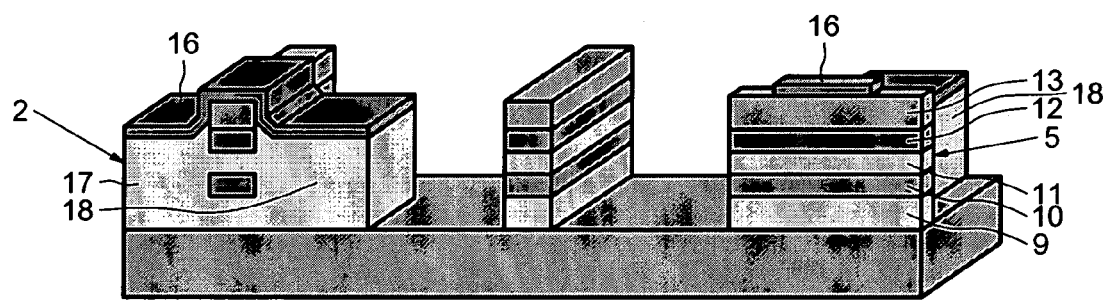

As may be seen in FIG. 4, a thick silicon-based layer 15 is then formed up to the level of the SiGe-based layer 12, followed by deposition of a localized protective layer 16 on top of part of the layer 15 and part of the mask 13 (see FIG. 5). The protective layer 16 may comprise silicon nitride deposited over the entire surface and then etched, using a lithography mask, selectively with respect to the $SiO_2$-based layer 13 and with respect to the Si-based layer 15. The layer 15 is then selectively etched, thus making it possible to define the active zones 2 and 5 comprising a source 17 and a drain 18 (see FIG. 5) which are protected by the protective layer 16. Said etching reaches the dielectric well 8.

Figure 6:
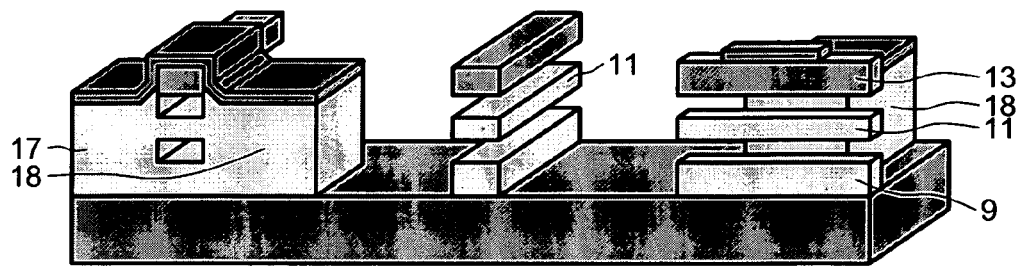
Figure 7:
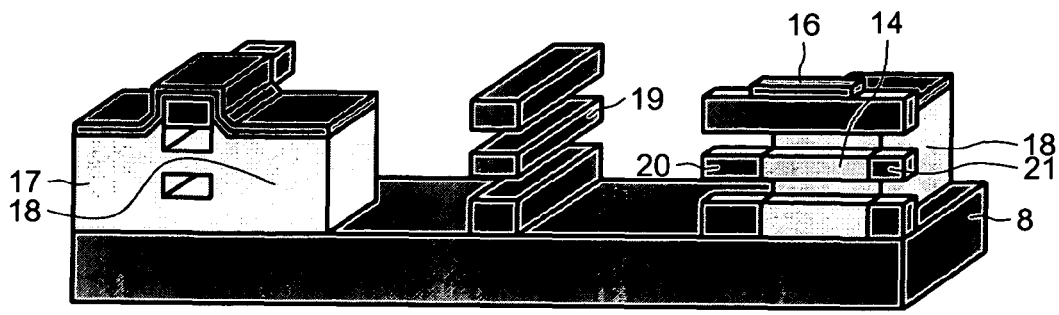
Figure 8:
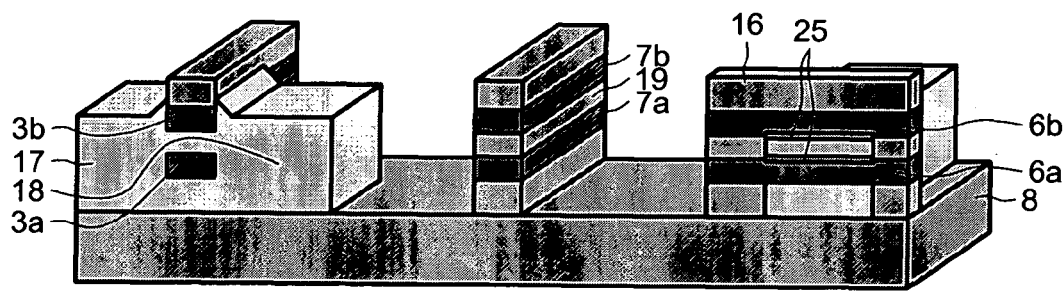

The remaining portions of the SiGe-based layers 10 and 12 are then selectively etched, while preserving the Si-based layers (see FIG. 6). This step may be carried out by isotropic plasma etching, for example using a $CF_4$-based plasma. The zones previously occupied by the SiGe-based layers 10 and 12 then become hollow.

An oxygen implantation step is then carried out using oxygen in ionic form $O^+$ or $O_2^+$ with an energy between 20 and 30 keV, for example 23 keV, and with a concentration between $5 \times 10^{15}$ $cm^{-2}$ and $5 \times 10^{16}$ $cm^{-2}$, for example $10^{16}$ $cm^{-2}$. Thanks to the protective layer 16 and the layer 13, the oxygen implantation is effected over the remaining portion of the silicon-based layer 11 corresponding to the location of the gate 7, hence the formation of a zone comprising silicon oxide 19 possessing excellent dielectric properties. The oxygen implantation is also carried out at the ends of the semiconductor channel 14 corresponding to the location of the gate 6, thereby producing ends 20 and 21 of the semiconductor channel 14 that are also based on $SiO_2$ and therefore possess excellent dielectric properties (see FIG. 7). The protective layer 16 is substantially impermeable to the oxygen implantation. The silicon parts located beneath the protective layer 16 are preserved everywhere, hence excellent selectivity of the implantation. In contrast, the oxide of the layer 13 is highly permeable to the oxygen implantation, hence good oxidation at the desired places, especially at the ends 20 and 21 and near the gate 7. The oxygen implantation also relates to the corresponding portions of the layer 9, beneath the lower gate 7a and beneath the ends 20 and 21, hence excellent isolation with respect to the substrate. An annealing operation is then carried out at a temperature between 900° C. and 1100° C., for example about 1000° C., for a few minutes.

Next, a thin gate oxide layer 25 is grown, for example with a thickness of about 1 to 2 nm, by heat treatment in oxygen. The gate oxide 25 serves as interface between the silicon of the channel 14 and the gate material. Next, the gate material is deposited over the entire surface and said material is anisotropically etched selectively with respect to the layer 13 in order to confine the gate material in the locations previously occupied by the remaining portions of the SiGe-based layers 10 and 12, in order to form a lower gate 3a and an upper gate 3b, on either side of the semiconductor channel 14 of the transistor 1, the lower gate 7a and upper gate 7b that are separated by the dielectric layer 19 and thus form two isolated conducting lines, and a lower electrode 6a and an upper electrode 6b of the transistor 4 that are separated at their center by the semiconductor channel 14 and at their ends by the dielectric zones 20 and 21 formed by oxidation of the ends of the semiconductor channel 14 (see FIG. 8). Thus, it is possible to achieve excellent control of the length of the semiconductor channel 14. The gate material may comprise metal. It is possible to choose a metal whose work function lies substantially in the middle of the valence band of silicon. The gate material may comprise TiN.

Figure 9:
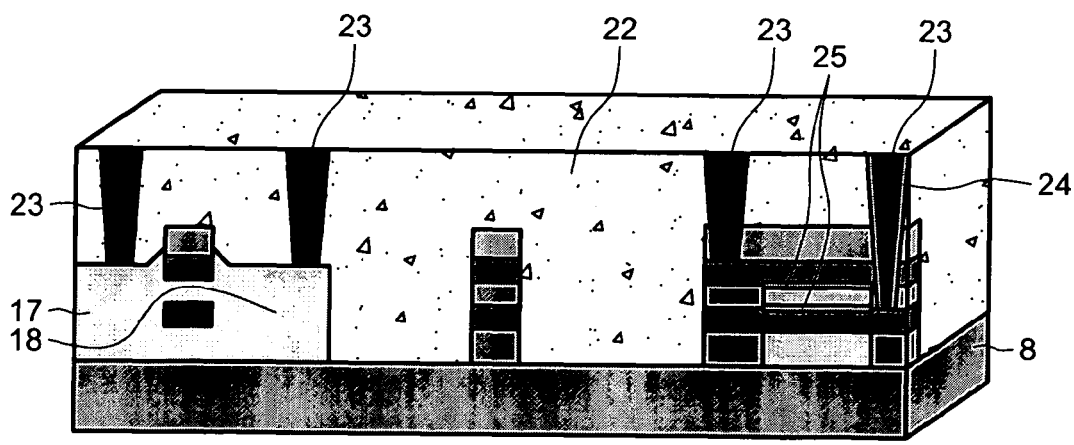

Next, the protective layer 16 is removed, for example by etching the SiN selectively with respect to the $SiO_2$, followed, as illustrated in FIG. 9, by implantations of the junctions, the silicidation of the contacts, deposition of a thick dielectric layer 22, for example based on $SiO_2$, formation of contact pads 23, for example based on metal, passing through the thick layer 22, in order to come into contact with the source or the drain of the transistor 1 and also passing through the dielectric layer 13 in order to come into contact with the upper gate 6b, and furthermore passing through the upper gate 6d and the dielectric zone 21 in order to come into contact with the lower gate 6a of the transistor 4. In the latter case, the contact pad 23 and the upper gate 6a are isolated by a thin layer of dielectric material 24 so as to avoid short-circuiting the lower 6a and upper 6b gates.

Annealing the implanted oxygen in part of the remaining portions of the silicon-based layer 11 ensures controlled diffusion of the oxygen species, depending on the temperature and on the duration of the annealing, hence excellent control of the oxidized part relative to the remaining part of the silicon-based layer 11 designed to form the semiconductor channel 14.

The geometry of the lower and upper gates of any one transistor is determined by the geometry of the SiGe-based portions that remain after the etching, as illustrated in FIG. 3, the material of the gates subsequently replacing the SiGe-based material that was removed. The same mask therefore serves to define the location of the lower gate and the location of the upper gate of the same transistor, hence excellent alignment between the gates. The mask also serves to define at least one dimension of the semiconductor channel, hence, here again, excellent geometry and satisfactory electrical properties of the transistor thus obtained.

Of course, the transistors 1 and 4 have been shown in a position turned one with respect to the other, so that it is possible to place, in the same figure, a longitudinal sectional view and a lateral sectional view of a transistor. However, an integrated circuit may comprise a large number of transistors similar to the transistor 1 and/or a large number of transistors similar to the transistor 4, and also tracks similar to the gate 7. Thus, excellent isolation between the upper and lower gates outside the active zones, and excellent isolation between the lower and upper gates at the ends of the semiconductor channel of a transistor, are obtained.

Thanks to the invention, the dielectric formed between the ends of the gates is therefore located beneath the gate mask and not beneath the mask corresponding to the active zones, this being achieved by the fact that silicon oxide is more permeable to the implants than the silicon nitride that can be used to form the protective layer. The aim is therefore to have the following superpositions corresponding to the state illustrated in FIG. 7, with, in line with just the gates, an Si/void/Si/void/oxide superposition, along an axis perpendicular to the main plane in line with just the active zones, an Si/protective layer superposition and, in line with the gates and with the active zones, an Si/void/Si/void/oxide/protective layer superposition.

In other words, the protective layer 16 placed on top of and in line with the parts intended to form the active zones lets through relatively little oxygen during the selective oxidation step, whereas the remaining parts of the dielectric layer 13 comprising an oxide, for example a silicon oxide, let through a relatively large amount of oxygen, thereby enabling the layer 19 and the ends 20 and 21 to be oxidized by anisotropic oxygen implantation passing through the layers placed at upper levels. The permeability to oxygen implantation of the oxide-based layers is therefore profitably employed for carrying out the selective oxygen implantation.

Moreover, the oxygen is preferably implanted after the material comprising SiGe has been removed. This makes it possible for the oxygen implants to be entirely located within the desired layer, thus minimizing the duration of the annealing operation.

Thus obtained is a transistor comprising two gates, a semiconductor channel lying between the gates, the channel being made of a first material, and a dielectric region lying between the gates, the semiconductor channel extending between two parts of the dielectric region and the dielectric region being based on an oxide of the first material.

Figure 10:
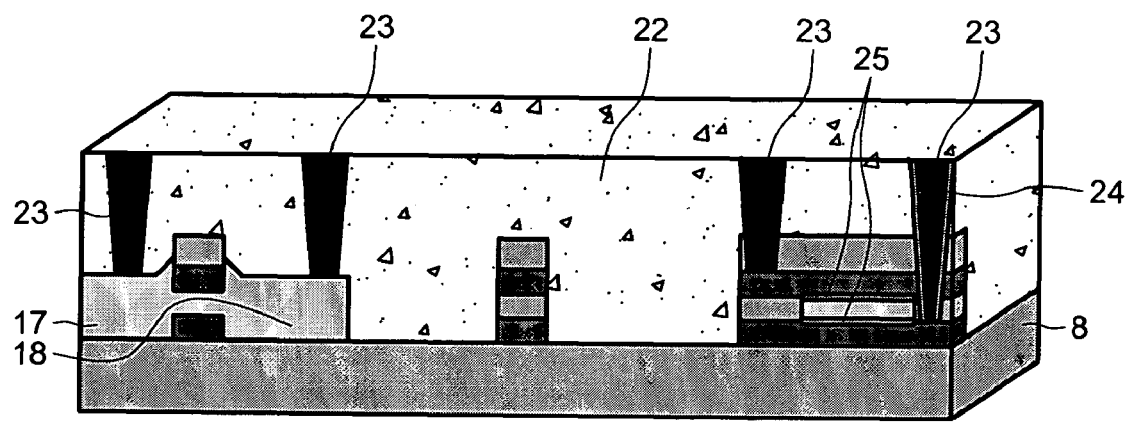
FIG. 10 is a schematic view corresponding to FIG. 9 of another embodiment.

In the embodiment illustrated in FIG. 10, the substrate is of the SiGe-on-insulator or SGOI type. In other words, the SiGe-based layer 10 is deposited directly on the substrate 8. The other fabrication steps are similar. Thus lower gates 3a and 6a resting on the substrate are obtained. The lower gates 7a serving as connection tracks also rest on the substrate 8.

The transistor may be fabricated by the formation of two gates, of a semiconductor channel lying between the gates, the channel being made of a first material, and of a dielectric region lying between the gates and comprising two parts, the semiconductor channel extending between the two parts of the dielectric region and the dielectric region being based on an oxide of the first material.

Thanks to the invention, excellent isolation between the gates is obtained beyond the ends of the semiconductor track.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for fabricating a planar transistor with two independent gates, comprising:
    forming a first layer of a semiconductor material on a second layer that is selectively etchable with respect to said first layer of semiconductor material;
    forming a third layer that is selectively etchable with respect to said material on said first layer of semiconductor material;
    selectively removing the selectively etchable material of the second and third layers;
    depositing a conducting material where the selectively etchable material has been removed to form first and second electrically independent gates for a single planar transistor device;
    forming a semiconductor channel for the single planar transistor device lying between the first and second electrically independent gates and comprising the first layer of the semiconductor material; and forming a dielectric zone lying between the first and second electrically independent gates and comprising an oxide of the semiconductor material.

2. The process according to claim 1, further comprising forming the dielectric zone by the selective oxidation of part of the material forming the semiconductor channel.

3. The process according to claim 2, wherein the selective oxidation comprises an implantation of oxygen ions.

4. The process according to claim 2, wherein the dielectric zone is formed by transformation annealing of the oxidized material.

5. The process according to claim 2, wherein the selective oxidation of part of the material forming the semiconductor channel comprises providing a mask largely impermeable to the oxygen implantation covering the channel and the active zones and providing a mask that is permeable to the oxygen implantation covering the electrically independent gates.

6. The process according to claim 1, wherein forming the semiconductor channel comprises depositing a layer of a material that is a semiconductor in the crystalline state and a dielectric in the oxidized state.

7. The process according to claim 1, wherein the selectively etchable material of the second and the third layers comprise SiGe.

8. A process for fabricating a planar transistor with two independent gates, comprising:
   forming a first layer of a sacrificial material;
   forming a second layer of a silicon material overlying the first layer;
   forming a third layer of the sacrificial material overlying the second layer;
   oxidizing first and second ends of the second layer to form first and second silicon oxide insulating regions between which exist a source region, channel region and drain region;
   removing the sacrificial material of the first and third layers to form voids above and below the channel region of the second layer; and
   filling the voids with a conductive material to form an upper and lower gate of the transistor, wherein filling comprises electrically isolating the conductive material of the upper gate from the conductive material of the lower gate.

9. The process of claim 8 wherein the sacrificial material is silicon-germanium.

10. The process of claim 8 further comprising, before filling the voids, forming upper and lower gate oxides in the voids at the channel region.

11. The process of claim 8 wherein the first layer is formed on a silicon layer which directly overlies an insulator and the sacrificial material is silicon-germanium.

12. The process of claim 8 wherein the first layer is formed directly overlying an insulator and the sacrificial material is silicon-germanium.

* * * * *